United States Patent

Hao

[11] Patent Number: 6,130,531
[45] Date of Patent: Oct. 10, 2000

[54] PHASE ANGLE MEASUREMENT METHOD AND SYSTEM IN ELECTRIC POWER SYSTEMS

[76] Inventor: Yushan Hao, 12 Qingnian Lu, Baoding, Hebei 071003, China

[21] Appl. No.: 08/836,574
[22] PCT Filed: Nov. 17, 1995
[86] PCT No.: PCT/CN95/00092
§ 371 Date: Jul. 2, 1997
§ 102(e) Date: Jul. 2, 1997
[87] PCT Pub. No.: WO96/16336
PCT Pub. Date: May 30, 1996
[51] Int. Cl.[7] .................................................. G01R 25/00
[52] U.S. Cl. ............................ 324/85; 324/76.77; 361/85
[58] Field of Search ................................. 361/85, 64, 66, 361/68, 69, 81; 324/85, 76.77

[56] References Cited

U.S. PATENT DOCUMENTS

| | | | |
|---|---|---|---|
| 3,027,513 | 3/1962 | Mulavey | 361/85 |
| 3,597,735 | 8/1971 | Nakayama | 361/85 |
| 3,986,079 | 10/1976 | Hinman | 361/85 |
| 4,878,208 | 10/1989 | Seki | 361/85 |

FOREIGN PATENT DOCUMENTS

| | | |
|---|---|---|
| 2119666 U | 10/1992 | China . |
| 2133847 | 5/1993 | China . |
| 1112247 | 11/1995 | China . |
| 0 564 220 A2 | 3/1993 | European Pat. Off. . |

*Primary Examiner*—Josie Ballato
*Assistant Examiner*—Jose M. Solis
*Attorney, Agent, or Firm*—Burns, Doane, Swecker & Mathis LLP

[57] ABSTRACT

A system and method for measuring phase-angle in electrical power systems includes inputting a reference signal into a receiving terminal of a communication system at a reference station and then sending the reference signal through the communication system. The reference signal is received at a substation and shaped as a quasi-reference signal. A phase difference $\beta$ between the quasi-reference signal and a tested signal at the substation is then measured. Phase delay of the reference signal caused by the communication system, including phase delay produced from sending means, receiving means, relaying units, and communication channels, is calculated. A phase difference $\alpha$ is then calculated between the reference signal and the tested signal according to the phase difference $\beta$ between the quasi-reference signal and the tested signal and the phase delay of the reference signal caused by the communication system.

25 Claims, 4 Drawing Sheets

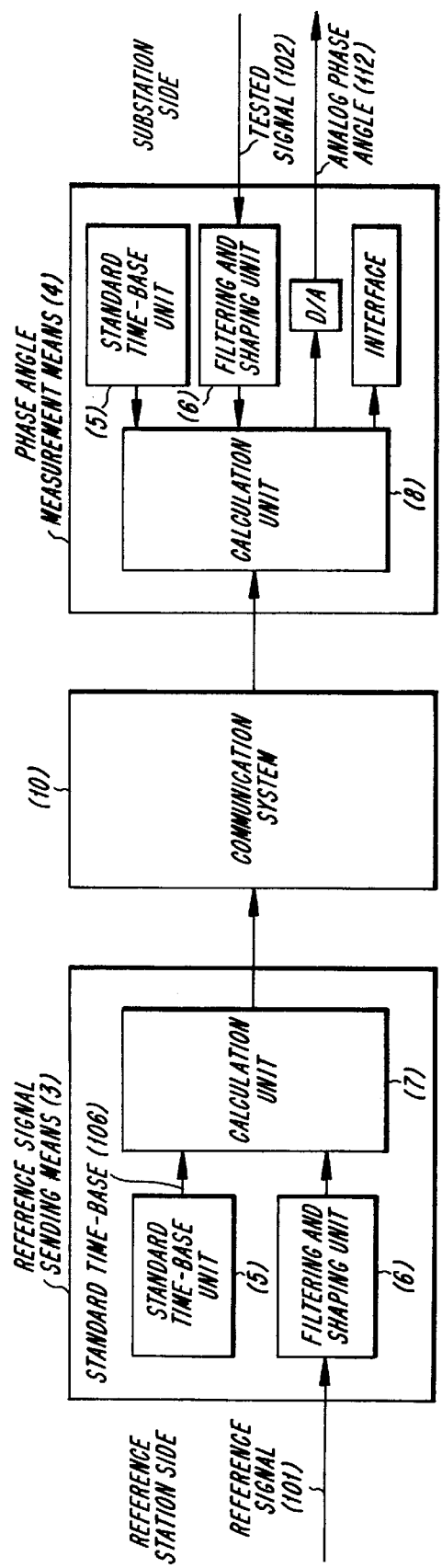
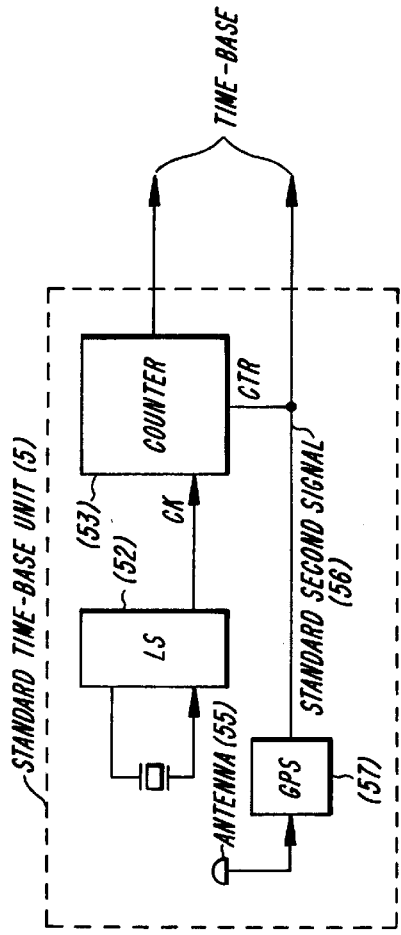
FIG. 2
FIG. 3

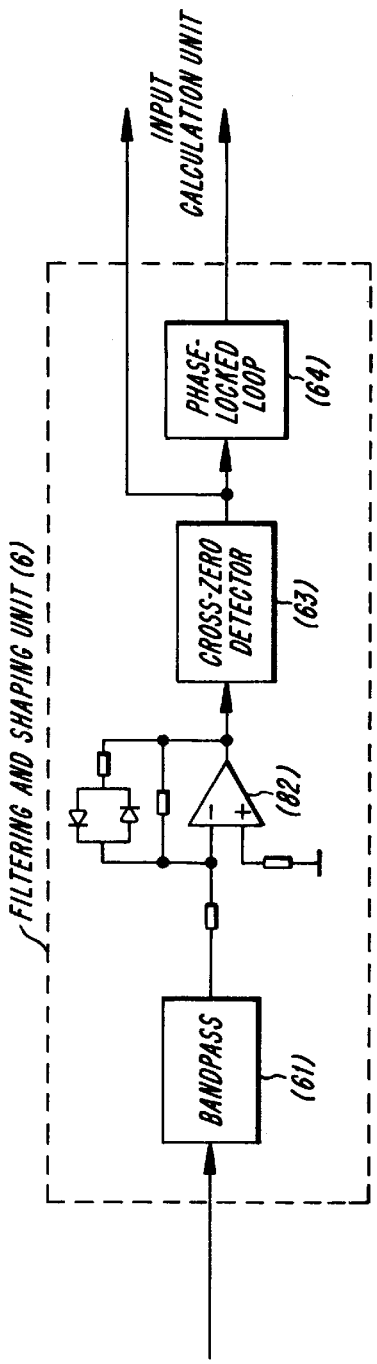
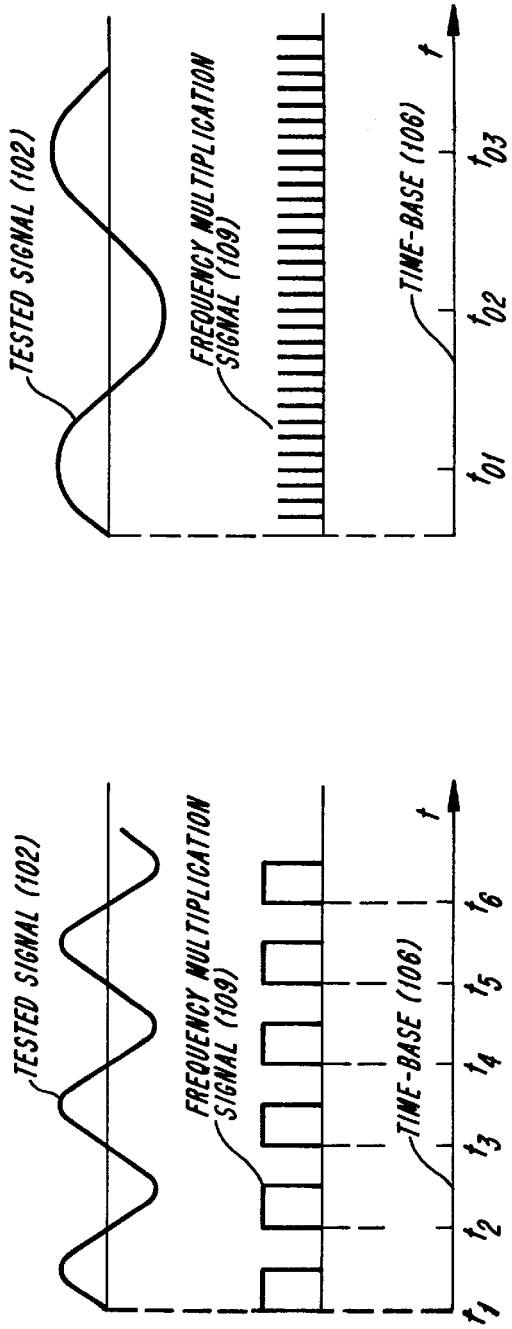
FIG. 4
FIG. 5(a)
FIG. 5(b)

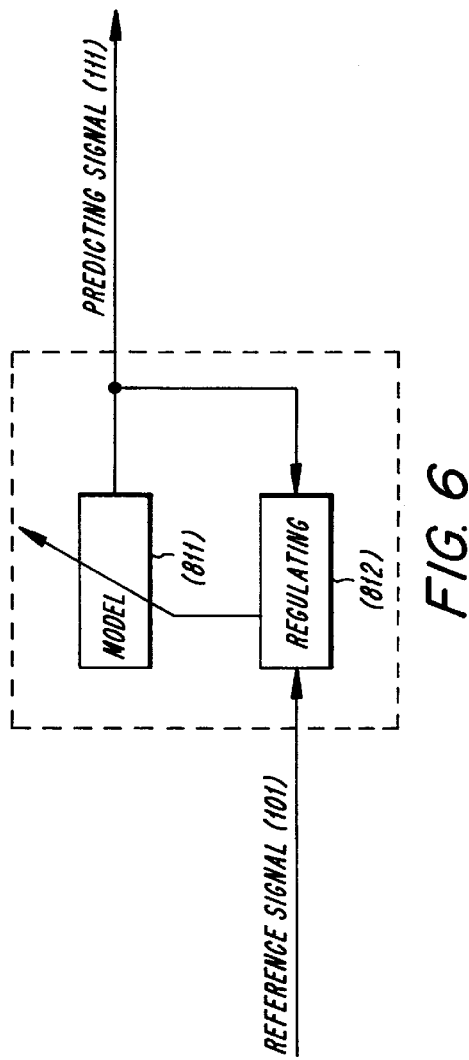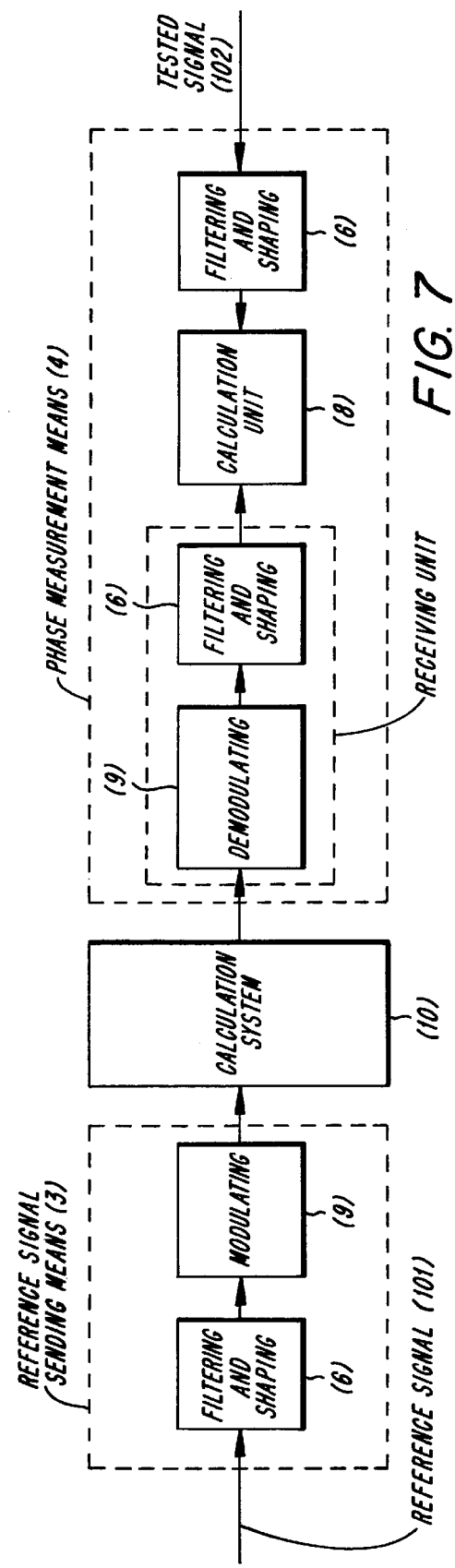

PHASE ANGLE MEASUREMENT METHOD AND SYSTEM IN ELECTRIC POWER SYSTEMS

FIELD OF THE INVENTION

The invention generally relates to electric power systems and their automation, particularly to the phase angle measurement method and system in electric power systems.

BACKGROUND OF THE INVENTION

One of the most important indexes of power systems is safe, steady operation. Therefore, a lot of expensive computers and communication equipment have been invested to set up scheduling and controlling systems having functions such as remote signaling, remote telemetering, remote controlling, remote tuning and safety monitoring of electric power systems. However, since an electric power system covers vast in territory, phase angle measurements can not be attained in real-time and directly. Phase angles are computed from power flow analysis or state estimations which are based on telemetering or voltages, active powers and reactive powers. This measurement method is not only inaccurate but also time consuming, and impossible to be used in safety and steady analysis or emergency control in electric power systems. Monitoring of power system stability has to be based on the change of active and reactive power in networks and steady state of power system be judged indirectly.

With development of science and technology, especially of computers, communication and satellite technology, it turns vast into near in territory to make phase angle measurements possible. There are, more, microwave and optical fiber communication with high speed and great capacity, and the global position system (GPS) having accurate location with ±15 m and accurate time within ±1 $\mu$s. These advanced communication means and technology provide pledge for this invention.

SUMMARY OF THE INVENTION

The main aim of the invention is to accurately measure phase angles of voltages, currents and electric potentials of generators in real-time with adding a few of equipment in current electric power communication systems. The measurement according the invention can reach 0.1° in accuracy and several times per cycle of power frequency.

Therefore, an object of the invention is to provide a precious phase angle measurement method and system by using GPS to sign time mark on signals to be broadcasted so as to prevent the signal from communication delay.

A further object of the invention is to provide a real-time precious phase angle measurement system by using GPS, computer and automation technology.

A further object of the invention is to provide a real-time phase angle precious measurement method and system by using modern automation technology to set up predicting model in order to avoid of time consumption of communication systems.

Another object of the invention is to provide a real-time precious phase angle measurement method and system by compensating phase delay in communication systems.

The invention provides a phase angle measurement method and system in electric power systems. The method comprises steps of a) at a reference station, measuring the relation between the reference signal phase and the time, determining the reference signal phase ($\phi_0$) at a series of given time, or determining the time ($t_0$) at a series of given phase;

b) sending the phase ($\phi_0$) of time ($t_0$) of the reference signal to each substation by communication;

c) at a substation, measuring the relation between a tested signal phase and the time, determining the phase of the tested signal ($\phi_m$) at the same given time as to the reference signal, or determining the time ($t_m$) at the same given phase of the tested signal as to the reference signal and storing the measurement values $\phi_m$ or $t_m$;

d) receiving the phase $\phi_0$ or time $t_0$ of the reference signal;

e) in accordance with $\phi_0$ received and $\phi_m$ stored, or $t_0$ received and $t_m$ stored, calculating the phase difference (called phase angle) between the tested signal and the reference signal.

Measuring step includes steps of filtering, shaping of sinusoidal signals and establishing standard time-base. In step of providing standard time-base, a standard second signal is provided by Global Position Systems (GPS), and frequency multiplication signal is produced so as to make resolving power of standard time-base signal into 1 $\mu$s. In addition, the measuring step further includes steps of locking phase and frequency multiplication, and in the calculation step the phase difference is calculated by using counting method. The calculation step also includes steps of predicting of the reference signal and regulating a reference signal according to received reference signal so as to make the difference between the predicting signal and the reference signal into zero.

A measurement system based on the method mentioned above includes at a reference station, a standard time-base unit for producing the standard time-base signal; at least one filtering and shaping unit; a calculation unit for calculating the phase of the reference signal ($\phi_0$) at a series of given time or the time ($t_0$) at a series of given phase of the reference signal;

at a substation, a standard time-base unit for producing the standard-time base signal; at least one filtering and shaping unit; a calculation unit for calculating the phase of the tested signal ($\phi_m$) at the same given time as to the reference signal or time ($t_m$) of the tested signal at the same given phase as to the reference signal, storing the value, and calculating the phase difference between the phase of the tested signal $\phi_m$ and phase of the reference signal $\phi_0$ or the time difference between $t_m$ and $t_0$;

a communication system for connecting the calculation unit at the reference station with the calculation unit at substations.

The invention provides another electric power system phase angle measuring method and system. The method comprises steps of a) at a reference station, the shaped reference signal being connected to the receiving terminal of a communication system;

b) sending the shaped reference signal to each substation through the communication system;

c) at a substation, receiving the reference signal, regulating the received signal and outputting the regulated reference signal;

d) measuring the tested signal;

e) calculating the phase angle by comparing the tested signal with the regulated reference signal, wherein in step c) said regulating step including step of compensating the phase delay caused by each parts of the communication system.

A phase angle measuring system based on said method according to the invention includes at a reference station, a means for sending a shaped reference signal into a communication system;

at a substation, a phase angle measurement means comprising a receiving unit for receiving the reference signal from the communication system, at least one measuring unit for measuring the tested signal at substation, and a calculation unit for calculating the phase difference between the tested signal and the reference signal.

BRIEF DESCRIPTION OF DRAWINGS

FIG. 2 is a block diagram of a phase angle measurement system using a timing method.

FIG. 3 is a detailed block diagram of the standard time-base unit in FIG. 2.

FIG. 4 is a detailed block diagram of the filtering and shaping unit in FIG. 2.

FIG. 5 is wave form of the phase angle measurement principle of timing method.

FIG. 6 is a principle diagram of predicting model adopted by calculation unit (8) in FIG. 2.

FIG. 7 is a block diagram of phase angle measurement system using compensating method.

DETAILED DESCRIPTION OF DRAWINGS

Figure 1:
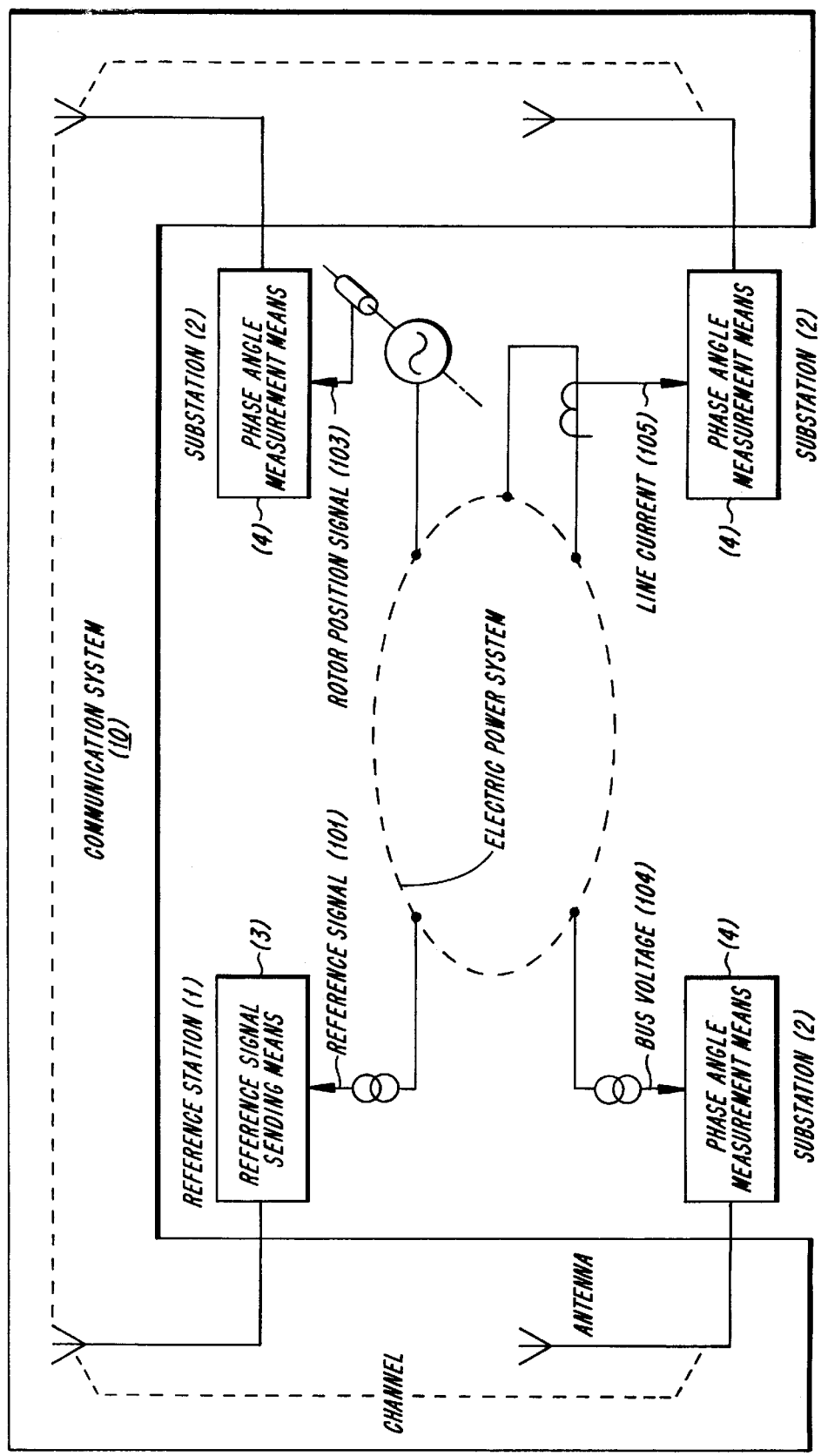
FIG. 1 is a diagrammatic sketch of phase angle measurement system for an electric power system.

FIG. 1 is a diagrammatic sketch of phase angle measurement system for an electric power system. Firstly, the reference substation (1) is selected among pivotal substations. At the reference station (1), the reference signal (101) is selected, such as a bus voltage signal from PT, and coupled to input terminals of a sending means (3). The reference signal sending means (3) measures the phase of the reference signal, and then sends it to communication system (10). The communication system (10) delivers the reference signal or phase message to a substation (2) which may be electric substations or power plants, etc. At substation (2), a phase angle measurement unit (4) not only receives the reference signal or phase message sent by communication system (10), but also inputs tested signal (102) of substation (2). In this embodiment, the tested signal may be rotor position signals (103) of generators, or bus voltage signals (104), or current signals (105) through electric lines. The phase difference between tested signal and the reference signal, named phase angle, is calculated by comparing them.

In practical, the phase angle must be phase difference between the tested signal phase and the reference signal phase, which is different from phase difference to two signals on one site or phase of itself. Since a power system is vast in territory, the phase angle measurement has to be completed by means of a communication system. In recent years, for communication technology and systems rapidly developed, in current power systems there are power-line carrier, microwave and optical fiber communication systems, which produces favorable conditions for accomplishing phase angle measurement. However, the communication equipment causes delay of signals, which brings phase delay to power-frequency signals, for example, 6° phase shift per 100 km to a 50 Hz signal in spit of the signal traveling on channel at light speed. Now, the area semidiameter of modern large power systems as far over 100 km, and therefore the phase shift at channel is not negligible. The key to be solved in the invention is to overcome phase shift of communication systems.

The phase angle measurement system using modern timing and computer technology in FIG. 2 overcomes the phase error caused by communication systems. Referring to FIG. 2, there is a standard time-base unit (5) in both of the reference signal sending means (3) at the reference station and the phase angle measurement means (4) at substation, which provides a standard time-base signal (106) whose resolving power is micro-second level at precious 1 $\mu$s. So, though substation (2) may be far from the reference station (1), the error of the standard time-base signal is within 2 $\mu$s, and phase angle error caused by time-base error is 0.036° for 50 Hz signals. Besides, at least one filtering and shaping unit (6) for filtering and shaping the reference signal (101) and the tested signal (102) is provided in both the reference signal sending means (3) and the phase angle measurement means (4) respectively. The signal sending means (3) and phase measurement means (4) further includes the calculation unit (7) and the calculation unit (8) respectively which measures and computes the signal at each side and calculates the phase angle $\alpha$ by comparing at unit (8).

Referring to FIG. 3–FIG. 5, the principle and detailed structure of standard time-base unit (5), the filtering and shaping unit (6) and the calculation unit in FIG. 2 are described below.

Firstly, referring to FIG. 3, there are many methods to get the standard time-base signal (106), such as crystal oscillating and standard second signal correcting method. An embodiment according to the invention is accomplished by using GPS and computer hardware. GPS receiver (51) receives signals of four satellite of GPS through antenna (55), and solves for three position variables and a time variable by solving four equations, and gives second signal (56) at high accuracy whose error is ±1 $\mu$s from Universal Standard Time (UTC). The second signal will be connected to clear-zero terminal clr of a counter (53) and to interrupt inputs of calculation unit (7) or calculation unit (8) respectively. The high frequency signal (more than 1 MHz) produced by a crystal oscillator (52) is coupled to clock terminal ck of a counter (52), and the output of the counter (53) is coupled to the calculation unit (7) or calculation unit (8). When rise edge of the second signal applies for interruption to calculation unit (7) or calculation unit (8), the computer reads values of the counter (53), the values named M, and at down edge of the second signal (56) the counter (53) will be cleared. As the edges of the pulse of the second signal are very steep (<1 $\mu$s), M is frequency of the crystal oscillator. Whenever a signal phase is measured, the computer reads out the value m of the counter (53). The ratio of m to M determines the time whose resolving power reaches microsecond level.

FIG. 4 gives an embodiment of the filtering and shaping unit (6). It includes at least one band pass filter (61), variable gain amplifier (62), cross-zero detector (63) and a locked phase loop circuit (64). The band pass filter (61) strains off noise and harmonics disturbance of the tested signal, and outputs a sinusoidal signal. For the sake of precious phase discrimination, the variable gain amplifier (62) is connected in series between the band pass filter (61) and cross-zero detector (63), which will turn the range near zero of sinusoidal signal into steeper so as to benefit cross-zero detecting. The cross zero detector (63) accomplishes phase discrimination and outputs square wave having the same phase as the sinusoidal signal, and the locked phase loop circuit (64) outputs frequency multiplication signal.

There are many methods to measure signal phase based on time-base signal (106), such as cross zero, initial phase at given time, FFT, etc. Since in the method of the cross zero or the initial phase the sampling period is too long, sometimes up to one cycle, even several cycles of the signal.

Therefore, in order to measure several times in one cycle, the invention adopts frequency multiplier and phase locked loop circuit to solve the problem.

The principle of frequency multiplier and phase locked loop circuit for reference signal (101) and tested signal (102) is shown in FIG. 5a and FIG. 5b. FIG. 5a is described for the tested signal (102), but it is available for the reference signal (101). Firstly, frequency multiplication signal (109) (double frequency in the figure as an example) is produced. Secondly, the time is read at rise edge of signal (109), named t1, t2, t3, t4, . . . , which represents a series of given phase (0° and 180° in the figure). According to FIG. 5a, for the reference signal (101), the time read is named $t_{ok}$, k=1, 2, . . . , for the tested signal (102), the time read is named $t_{mk}$, k=1, 2, . . . . Then the kth measurement phase angle between the tested signal (102) and the reference signal (101) is $\alpha_k$:

$$\alpha_k = 360(t_{mk} - t_{ok})/T \quad (1)$$

where, T is measurement cycle of the reference signal (101). It is thus clear that the phase angle can be measured more times (twice) every cycle according to the method, which is named timing method as given phase.

In FIG. 5b, the tested signal (102) is frequency multiplicated and phase locked as signal (109) (signal (109) is 20 times frequency of signal (102) in the figure, more than 4096 in practice). At rising edge of the tested signal (102), the counter is cleared and then started to count for signal (109). At given time t1, t2, . . . , (which are agreed in advance or broadcasted by the reference station), the computer in the calculation unit (7) or unit (8) reads values of the counter, which is named $n_{ok}$ for the reference signal and named $n_{mk}$ for the tested signal respectively, k=1, 2, . . . . Therefore, the kth phase angle measurement value between the tested signal (102) and the reference signal (101) is $$\alpha_k = 360(n_{mk} - n_{ok})/N \quad (2)$$

where, N is multiple of the frequency multiplier (20 in the Figure). Then this method can measure signal phase several times per cycle, named timing method at given time.

Now, let us refer to the operation of the phase angle measurement system in FIG. 2. At the reference station (1), firstly, the reference signal (101) is coupled to input of the filtering and shaping unit (6). The signal is filtered and shaped to strain off disturbance, turned into a square wave or sinusoidal signal which has the same phase as the reference signal. Then the signal is coupled to the calculation unit (7). Secondly, the standard time-base signal (106) produced by standard time-base unit (5) is also coupled to the calculation unit (7). Thirdly, in the calculation unit (7), according to the timing method at given phase in FIG. 5a or at given time in FIG. 5b, by the standard time base signal (106) and the sinusoid or square wave signal, the phase message ($t_{ok}$ or $n_{ok}$) of the reference signal is measured. Finally, the phase message is output to communication system (10). The communication system (10) delivers $t_{ok}$ or $n_{ok}$ to every substation (2).

The calculation unit (8) at substation (2) receives the phase message ($t_{ok}$ or $n_{ok}$) of the reference signal sent by the communication system. On the other hand it inputs shaped signal of the tested signal (102) and the standard time-base signal (106) from standard time-base unit (5) in order to measure the phase message ($t_{mk}$ or $n_{mk}$). The calculation unit (8) calculates the phase angle between the tested signal (102) and the reference signal (101) by formula (1) or (2).

In accordance with the above illustration, the real time phase angle measurement can be accomplished in principle, but problem is still exist in technology. This is because transmitting the phase message ($t_{ok}$ or $n_{ok}$) of the reference signal by the communication system needs time, and transmission speeds on channel is 1200~4800 bps generally, it needs 35~100 ms to send the phase message, namely 2~5 cycle, so it is disappointing in real-time. If the communication system has surplus channel, in the method, a data multiplexor can be connected in series between sending means (3) or phase angle measurement means (4) and the communication system (not shown in the figure).

The invention gives another real time measuring method shown in FIG. 2 and FIG. 6. In the calculation unit (8) of the phase angle measurement means (4) in FIG. 2, a predicting modular (81) is added which includes a model modular (811) and a regulating modular (812). The model modular (811) outputs predicting message $\hat{r}$ (111) and its phase message ($\hat{t}_{ok}$ or $\hat{n}_{ok}$). The output phase message ($\hat{t}_{ok}$ or $\hat{n}_{ok}$) of modular (811) is feedback to the regulating modular (812). The regulating modular (812) also inputs the phase message ($t_{ok}$ or $n_{ok}$) of the reference signal (101). The regulating modular (812) outputs signals to change parameters of the model in modular (811) to make error ($t_{ok} - \hat{t}_{ok}$) or ($n_{ok} - \hat{n}_{ok}$) close to zero.

The model and regulating modular are designed based on adaptive control theory, or on 2nd order model. Considering the inertia of power systems is very large and change of frequency of the reference signal is slow, though large disturbance caused by tripping generator or dropping load can result in total power increasing or decreasing. So, the phase dynamic equation of the reference signal is 2nd order of uniform acceleration:

$$\hat{f} = f_0 + a \times t \quad (3)$$

$$\hat{\Phi}_0 = \Phi_0 + 360 \times f_0 \times t + 180 \times a \times t^2 \quad (4)$$

where, a is acceleration, undetermined parameter, t is time interval, $\hat{f}$ and $\hat{\Phi}_0$ is predicting value of the reference signal. a is adjusted by proportion or proportional-integrate to make difference between the predicting output and reference signal close to zero.

So, measuring the phase angle between the tested signal (102) and the reference signal (101) can be accomplished by measuring the phase angle between the tested signal (102) and the predicting signal (111).

Besides the above timing method, the invention also provides a phase compensating method to measure the phase angle shown in FIG. 7.

In FIG. 7, at the reference station (1), the reference signal sending means (3), which includes the filtering and shaping unit (6) and modulate-demodulator (9), produces the reference signal and modulates the signal phase on carrier signal by the modulator (9). The carrier signal is delivered to substations (2) by communication systems (10). At the substation (2), the phase angle measurement means (4) includes demodulator (9), filtering and shaping unit (6), calculation unit (8) and another filtering and shaping unit (6). Wherein, the demodulator (9) receives the phase of the reference signal sent by the communication system, demodulated signal r' (112) is named as quasi-reference signal. This signal is coupled to the calculation unit (8) after filtered and shaped by the filtering and shaping unit (6). Simultaneously, the calculation unit (8) also receives the tested signal which is filtered and shaped by the other filtering and shaping unit (6). A phase difference β between the tested signal (102) and the quasi-reference signal is calculated in unit (8) according to the clocks of a crystal oscillator. In the communication system there is delay, including sending means delay $\Delta t_1$, receiver delay $\Delta t_2$, relay equipment delay $\Delta t_3$ and channel delay $\Delta t_4$, which results in phase delay of the reference signal, respectively named $\Delta\alpha_1$, $\Delta\alpha_2$, $\Delta\alpha_3$, and $\Delta\alpha_4$. The phase angle $\alpha$ between the tested signal (102) and the reference signal (101) is given as $$\alpha = \beta + \Delta\alpha_1 | \Delta\alpha_2 + \Delta\alpha_3 + \Delta\alpha_4 \quad (5)$$

To communication system equipment, when the amplitude of transmitted signal is constant and frequency changes not very much (power-frequency), the phase delay is constant. The phase delay $\Delta\alpha_4$ caused by communication channel can be computed as $$\Delta\alpha_4 = 0.06 \times L \quad (6)$$

where, L is the channel length, unit is km. Although formula (6) is for 50 Hz signal, for another frequency, it can be inferred by proportion.

The above embodiments and figures are only for understanding the invention. These embodiments can also be alternated to many kinds of forms. Firstly, the phase angle measurement is adapted to the other same frequency signal, such as square wave or pulse signals besides the sinusoid, and is also adapted to harmonics signals. Secondly, the reference signal can be a center pivotal bus voltage signals, or a generator rotor position signal, or combined signals of some center pivotal bus voltage signals and some generator position signals. The above sinusoidal signal is any phase signal among three phase signals, also positive sequence or negative sequence or zero sequence signals, only a positive, or negative, or zero sequence filter need to be connected in series. Lastly, the phase angle output is also regulated by the phase shift produced by transformer of non-12 clock connection between the tested signal and the reference signal, which is traditional knowledge to a person skilled.

Some technicians in the field of the art can do many variations from the invention, but they will fall in the scope of the claims of the invention.

I claim:

1. A method of measuring phase-angle in electric power systems, comprising the steps of:
   a) at a reference station, measuring the relation between the phase of a reference signal and a standard time-base by determining the phase of a reference signal $\phi_0$ at a series of given times with regular intervals;
   b) sending said phase $\phi_0$ of the reference signal to each substation by communication;
   c) at a substation, measuring the relation between the phase of a tested signal and the standard time-base by determining the phase of the tested signal $\phi_m$ at the same given times with regular intervals as to the reference signal;
   d) at the substation, receiving said $\phi_0$ of the reference signal; and
   e) at the substation, in accordance with said $\phi_0$ received and $\phi_m$ stored, calculating the phase difference $\alpha$ between the tested signal and the reference signal.

2. A method of measuring phase-angle in electric power systems according to claim 1, wherein steps a) and c) further include steps of filtering and shaping the reference signal and the tested signal.

3. A method of measuring phase-angle in electric power systems according to claim 1, wherein said standard timebase including standard signals generated by a Global Position System (GPS), and a frequency multiplication timebase.

4. A method of measuring phase-angle in electric power systems according to claim 1, wherein measuring steps a) and step c) further include steps of locking phase and frequency multiplication.

5. A method of measuring phase-angle in electric power systems according to claim 1, wherein calculating step e) further includes steps of predicting the reference signal according to a predicting model and regulating the predicting model by the difference between the predicting signal and the reference signal.

6. A method of measuring phase-angle in electric power systems according to claim 5, wherein said predicting model is a quadratic or cubic dynamic equation and said regulating step uses proportional-intergral control.

7. An electric power system phase angle measuring system including a communication system, comprising:
   at a reference station,
      a standard time-base unit for producing a standard time-base signal of the reference station, which is connected to a calculation unit;
      at least a filtering and shaping unit for filtering random disturbance among reference signals, which is connected to said calculation unit;
      said calculation unit, which is connected with said communication system, for computing a phase ($\phi_0$) of the reference signal at a series of given times with regular intervals; and
   at a substation,
      a standard time-base unit for producing the standard time base signal, which is connected to a calculation unit;
      at least a filtering and shaping unit for filtering random disturbance of a tested signal, which is connected to the calculation unit;
      said calculation unit for calculating phase of a tested signal $\phi_m$ at the given times, storing said phase $\phi_m$, receiving $\phi_0$ of the reference signal sent by communication, and calculating the phase angle between the tested signal and the reference signal according to $\phi_m$ and $\phi_0$;
   the calculation unit at the reference station is connected to the calculation unit at substations by the communication system.

8. An electric power system phase angle measuring system including a communication system according to claim 7, wherein said filtering and shaping unit at least includes a band pass filtering and shaping circuit.

9. An electric power system phase angle measuring system including a communication system according to claim 7, wherein said standard time-base unit includes a standard clock signal generator, a frequency multiplication means and a counter.

10. An electric power system phase angle measuring system including a communication system according to claim 9, wherein the standard clock signal generator includes a receiver of a Global Position System (GPS) and the frequency multiplication means includes a crystal oscillator.

11. An electric power system phase angle measuring system including a communication system according to claim 7, wherein a data multiplexor is connected between the communication system and the calculation unit.

12. An electric power system phase angle measuring system including a communication system according to claim 7, wherein the calculation unit at the substation includes a predicting model and a regulating model for predicting the reference signal.

13. A method of measuring phase-angle in electric power systems, comprising the steps of:
   a) at a reference station, measuring the relation between the phase of a reference signal and a standard time-base, by determining the time $t_0$ at a series of given phases;
   b) sending said time $t_0$ to each substation by communication;
   c) at a substation, measuring the relation between the phase of a tested signal and the standard time-base, by determining the time $t_m$ at the same given phase of the tested signal as to the reference signal, and storing said measurement $t_m$;
   d) at the substation, receiving said $t_0$ of the reference signal; and
   e) at the substation, in accordance with said $t_0$ received and $t_m$ stored, calculating the phase difference α between the tested signal and the reference signal.

14. A method of measuring phase-angle in electric power systems according to claim 13, wherein steps a) and c) further include steps of filtering and shaping the reference signal and the tested signal.

15. A method of measuring phase-angle in electric power systems according to claim 13, wherein said standard time-base including standard signals generated by a Global Position System (GPS), and a frequency multiplication time-base.

16. A method of measuring phase-angle in electric power systems according to claim 13, wherein measuring steps a) and step c) further include steps of locking phase and frequency multiplication.

17. A method of measuring phase-angle in electric power systems according to claim 13, wherein calculating step e) further includes steps of predicting the reference signal according to a predicting model and regulating the predicting model by the difference between the predicting signal and the reference signal.

18. A method of measuring phase-angle in electric power systems according to claim 17, wherein said predicting model is a quadratic or cubic dynamic equation and said regulating step uses proportional-integral control.

19. An electric power system phase angle measuring system including a communication system, comprising:
   at a reference station,
      a standard time-base unit for producing a standard time-base signal of the reference station, which is connected to a calculation unit;
      at least a filtering and shaping unit for filtering random disturbance among reference signals, which is connected with said communication system, for computing a time ($t_0$) at a series of given phase of the reference signal; and
   at a substation,
      a standard time-base unit for producing the standard time base signal which is connected to a calculation unit;
      at least a filtering and shaping unit for filtering random disturbance of a tested signal, which is connected to the calculation unit;
      said calculation unit for calculating time of the tested signal $t_m$ at the given phase, storing said values $t_m$, receiving $t_0$ of the reference signal sent by communication, and calculating the phase angle between the tested signal and the reference signal according to $t_m$ and $t_0$;
      the calculation unit at the reference station is connected to the calculation unit at substations by the communication system.

20. An electric power system phase angle measuring system including a communication system according to claim 19, wherein said filtering and shaping unit at least includes a band pass filtering and shaping circuit.

21. An electric power system phase angle measuring system including a communication system according to claim 19, wherein said standard time-base unit includes a standard clock signal generator, a frequency multiplication means and a counter.

22. An electric power system phase angle measuring system including a communication system according to claim 21, wherein the standard clock signal generator includes a receiver of a Global Position System (GPS) and the frequency multiplication means includes a crystal oscillator.

23. An electric power system phase angle measuring system including a communication system according to claim 19, wherein a data multiplexor is connected between the communication system and the calculation unit.

24. An electric power system phase angle measuring system including a communication system according to claim 19, wherein the calculation unit at the substation includes a predicting model and a regulating model for predicting the reference signal.

25. A method of measuring phase-angle between an electrical signal at a reference station and an electrical signal at a remote station in an electrical power system comprising:
   obtaining a reference signal comprising a sinusoidal quantity at said reference station;
   frequency multiplying said sinusoidal reference signal to produce a first square-wave signal;
   determining times of rising edges of said first square-wave signal as referenced to a standard time-base;
   obtaining a tested signal comprising a sinusoidal quantity at said remote station;
   frequency multiplying said sinusoidal tested signal to produce a second square-wave signal;
   determining times of rising edges of said second square-wave signal as referenced to said standard time base;
   transmitting said times of said rising edges of said first square-wave signal to said remote station; and
   calculating a phase-angle between said tested and said reference signals using said transmitted times of said rising edges of said first square-wave signal and said determined times of said rising edges of said second square-wave signal.

* * * * *